United States Patent
Tseng

(10) Patent No.: US 6,413,836 B1
(45) Date of Patent: Jul. 2, 2002

(54) METHOD OF MAKING ISOLATION TRENCH

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 6 days.

(21) Appl. No.: 09/665,736

(22) Filed: Sep. 20, 2000

(51) Int. Cl.[7] .............................................. H01L 21/76
(52) U.S. Cl. ...................... 438/424; 438/296; 438/427; 257/510
(58) Field of Search ................................ 438/296, 424, 438/427; 257/510

(56) References Cited

U.S. PATENT DOCUMENTS

| | | | | |
|---|---|---|---|---|
| 5,360,753 A | * | 11/1994 | Park et al. ................ | 438/439 |
| 5,677,232 A | * | 10/1997 | Kim et al. ................ | 438/424 |
| 5,731,221 A | * | 3/1998 | Kwon ..................... | 438/424 |
| 5,747,377 A | * | 5/1998 | Wu ........................ | 438/444 |
| 5,753,561 A | * | 5/1998 | Lee et al. ................. | 438/424 |
| 5,756,389 A | * | 5/1998 | Lim et al. ................ | 438/427 |
| 5,795,811 A | * | 8/1998 | Kim et al. ................ | 438/404 |
| 5,866,466 A | * | 2/1999 | Kim et al. ................ | 438/426 |
| 6,200,881 B1 | * | 3/2000 | Lou ........................ | 438/424 |
| 6,069,057 A | * | 5/2000 | Wu ........................ | 438/424 |
| 6,090,685 A | * | 7/2000 | Gonzales et al. ........ | 438/425 |
| 6,197,658 B1 | * | 3/2001 | Jang ....................... | 438/424 |

FOREIGN PATENT DOCUMENTS

JP 10-12716 * 10/1998 ........... H01L/21/76

OTHER PUBLICATIONS

Fazen et al., *IEDM Tech. Digest*, pp. 57–60, 1993.

* cited by examiner

Primary Examiner—Charles Bowers
Assistant Examiner—David S Blum
(74) Attorney, Agent, or Firm—Intellectual Property Solutions, PLLC

(57) ABSTRACT

A method of making an isolation trench structure in a semiconductor substrate is disclosed. A first layer is formed on a semiconductor substrate. The first layer is subsequently patterned to form islands to protect active areas in the semiconductor substrate. A second layer is conformally formed over the islands and the remaining portions of the substrate. The second layer is then anisotropically etched to form spacers on sidewalls of the islands. The substrate is subjected to a thermal oxidation process, thereby forming thermal oxide masks at positions which are not covered with the islands and the spacers. Thereafter, the sidewall spacers are selectively removed to expose the substrate between the islands and the oxide masks. Then, isolation trenches are etched through the exposed substrate using the islands and the oxide masks as etch masks. The isolation regions made according to the present invention have the widths beyond lithography limit.

11 Claims, 4 Drawing Sheets

METHOD OF MAKING ISOLATION TRENCH

BACKGROUND OF THE INVENTION

1. Field of the Invention

The present invention relates in general to device isolation techniques. More particularly, it relates to an method of making an isolation trench structure in a semiconductor substrate.

2. Description of the Related Arts

As integrated circuit devices become more highly integrated and include finer geometries, it can become increasingly important to reduce the size of isolation regions that are used to isolate active devices such as transistors from one another. The initial formation of isolation regions may determine the size of an active region and the process margins for subsequent processing. Accordingly, reduction of the size of the isolation regions is desirable.

LOCal Oxidation of Silicon (LOCOS) is widely used for fabricating isolation regions in integrated circuits. The LOCOS process can be simple. However, in highly integrated devices, such as 256 MB DRAM devices, as the width of the isolation region is reduced, a punchthrough may be caused by "bird's beak" during oxidation. This may reduce the thickness of a field oxide film and may reduce the size of the active regions. An isolation method may also use a trench, rather than forming a field oxide layer by thermal oxidation. In trench isolation methods, a trench is formed on the integrated circuit device and is filled with an insulating material such as an oxide layer, to thereby form an isolation region that can be smaller than that formed by the LOCOS method. Moreover, problems of the LOCOS method and problems caused by the thermal oxidation can be controlled.

A trench isolation method is disclosed in "A Highly Manufacturable Trench Isolation Process for Deep Submicron DRAMs", IEDM Tech. Digest, pp. 57–60, 1993, by P. Fazan et al. As disclosed, a pad oxide layer and a silicon nitride layer are formed and patterned on an integrated circuit substrate. The integrated circuit substrate is then etched using the patterned silicon nitride layer and pad oxide layer as a mask, to form a trench. Then, a sidewall of the trench is thermally oxidized, and an oxide layer is formed in the trench by chemical vapor deposition. The oxide layer is then planarized by Chemical Mechanical Polishing (CMP). Subsequently, the silicon nitride layer is removed, and an oxide spacer is formed on the sidewall of the oxide layer. The pad oxide layer is then wet etched to complete an isolation layer and to form a gate oxide layer and a gate.

The ever-present pressure upon the microelectronics industry to shrink electronic devices and to crowd a higher number of electronic devices onto a single die, called miniaturization, has required the use of such structures as isolation trenches. However, according to conventional trench isolation methods, reduction of the width of the isolation regions is limited by lithography resolution. In consequence, it would be a significant improvement in the state of the art if the width of the isolation region can be reduced beyond lithography limit.

SUMMARY OF THE INVENTION

An object of the invention is to provide a method of making isolation trenches having the widths beyond lithography limit.

To attain the above and other objects, the present invention provides a method of making an isolation trench structure in a semiconductor substrate. A first layer is formed on a semiconductor substrate. By way of non-limiting example, the first layer is a dielectric layer such as an oxide layer. The dielectric layer is subsequently patterned to form insulator islands to protect active areas in the semiconductor substrate. A second layer is conformally formed over the dielectric islands and the remaining portions of the substrate. The second layer is then anisotropically etched to form spacers on sidewalls of the insulator islands. The substrate is subjected to a thermal oxidation process, thereby forming thermal oxide masks at positions which are not covered with the insulator islands and the sidewall spacers. Thereafter, the sidewall spacers are selectively removed to expose the substrate between the islands and the thermal oxide masks. Then, isolation trenches are etched through the exposed substrate using the islands and the thermal oxide masks as masks.

According to the invention, because the width of the trench is determined by the width of the sacrificial spacer, not by lithography resolution, the isolation trench can be made narrower beyond lithography limit.

Other objects, features, and advantages of the present invention will become apparent from the following detailed description which makes reference to the accompanying drawings.

DETAILED DESCRIPTION OF THE INVENTION

Figure 1:
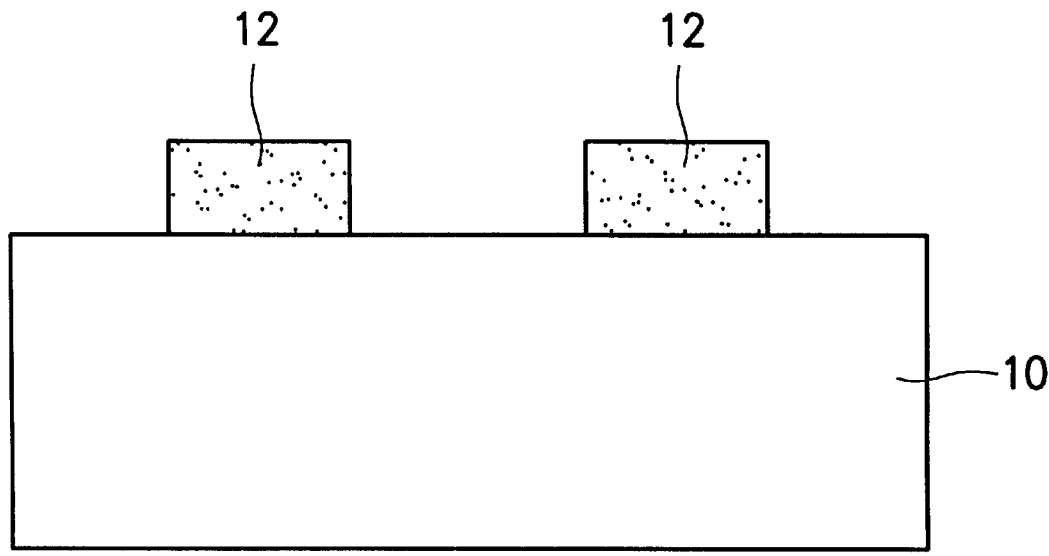
FIGS. 1–9 are schematic cross-sectional views illustrating trench isolation methods according to a preferred embodiment of the invention.

Referring now to FIGS. 1–9, a preferred method of making trench isolation regions according to an embodiment of the present invention will be described. As illustrated in FIG. 1, the method of the present invention begins by providing a silicon substrate 10. In the context of this document, the term "silicon substrate" is meant to include devices formed within a silicon wafer and the layers overlying the wafer. The term "substrate surface" is meant to include the upper most exposed layers on a silicon wafer, such as silicon surface and an insulating layer.

A first layer is formed on a semiconductor substrate 10. By lay of non-limiting example, the first layer is a dielectric layer such as an oxide layer. The first layer is subsequently patterned with a mask. An anisotropic etch selectively removes portions of the first layer to form insulator islands 12 as shown in FIG. 1. The insulator islands 12 are patterned over and protect parts of active areas (not pictured) in the semiconductor substrate 10 during subsequent isolation trench processing.

Figure 2:
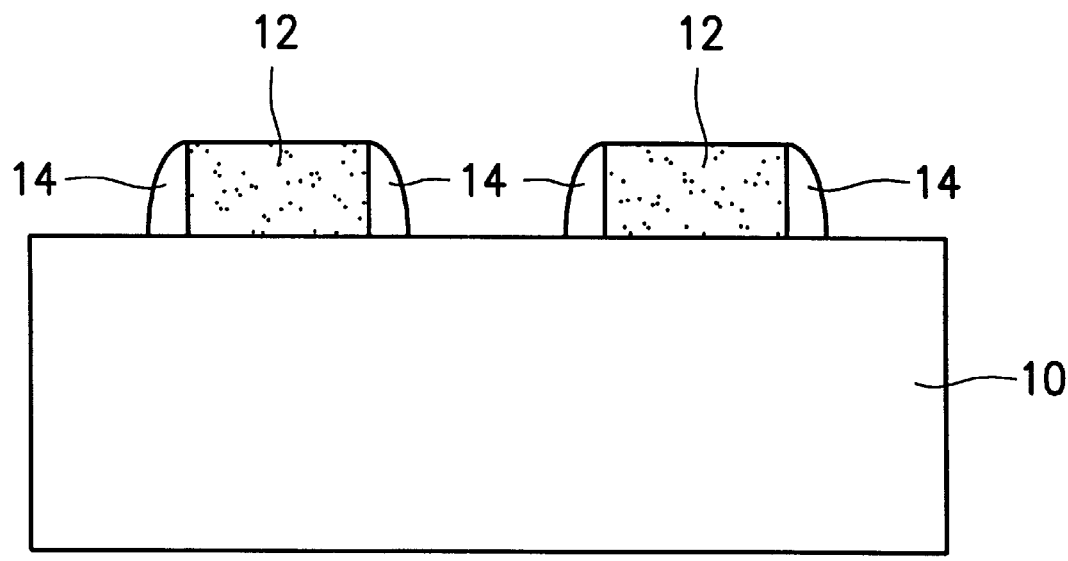

Referring to FIG. 2, sidewall spacers 14 are formed on sidewalls of the insulator islands 12. A second layer is conformally deposited over insulator islands 12 and exposed portions of substrate 10. Then, the second layer is anisotropically etched back by a plasma etch to expose the substrate surface. As a result, the residual portions of the second layer form sidewall spacers 14 on sidewalls of the insulator islands 12. The second layer may be formed by a plasma enhanced chemical deposition (PECVD) process so as to deposit a nitride layer such as $Si_3N_4$ or equivalent. When sidewall spacers 14 are formed of nitride, the insulator islands would be selected to be composed of a substantially different material, such as an oxide. Formation of substantially different materials facilitate selective removal of the spacers 14 (as described below in conjunction with FIG. 4).

Figure 3:
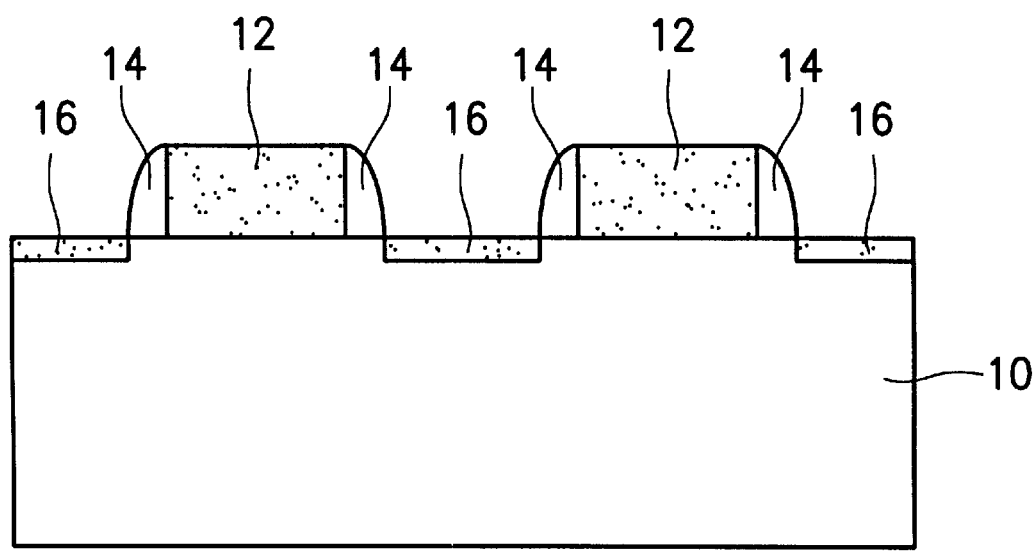

Referring to FIG. 3, following the formation of the spacers 14, oxide masks 16 are formed at the remaining portions of the substrate 10. The silicon substrate 10 is subjected to thermal oxidation to form silicon oxide masks 16 at positions which are not covered with the insulator islands 12 and the sidewall spacers 14.

Figure 4:
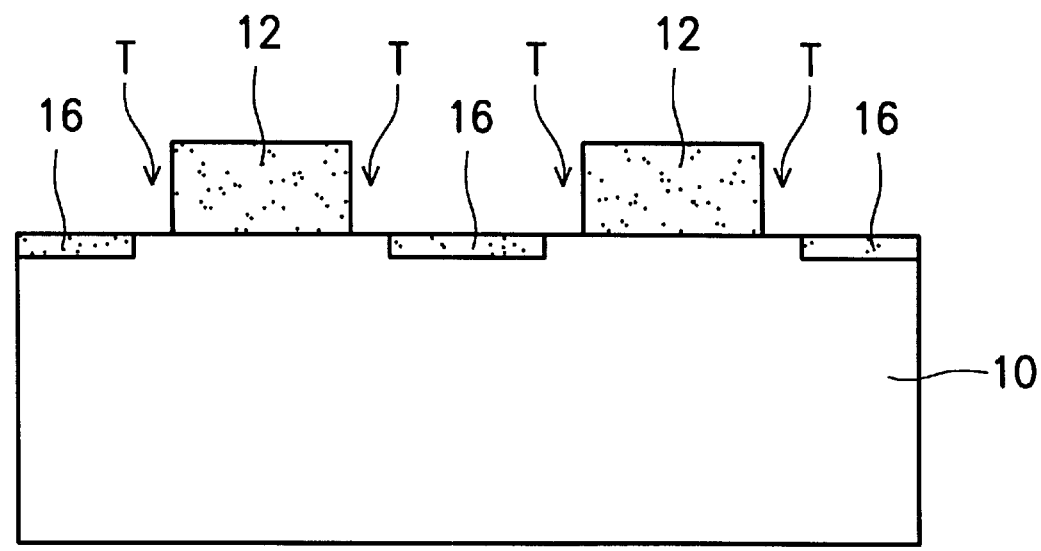

Following the formation of the oxide masks 16, the sidewall spacers 14 are selectively removed to expose the substrate between the insulator islands 12 and the oxide masks 16, as shown in FIG. 4. The spacers 14, for example, nitride spacers, are removed selectively relative to the insulator islands 12 and the oxide masks 16 by either a wet or dry etch thereof. Accordingly, it is preferable that the insulator islands 12 and the oxide masks 16 are made from the same material such that the etch will be substantially uniform as to the selectivity thereof.

Figure 5:
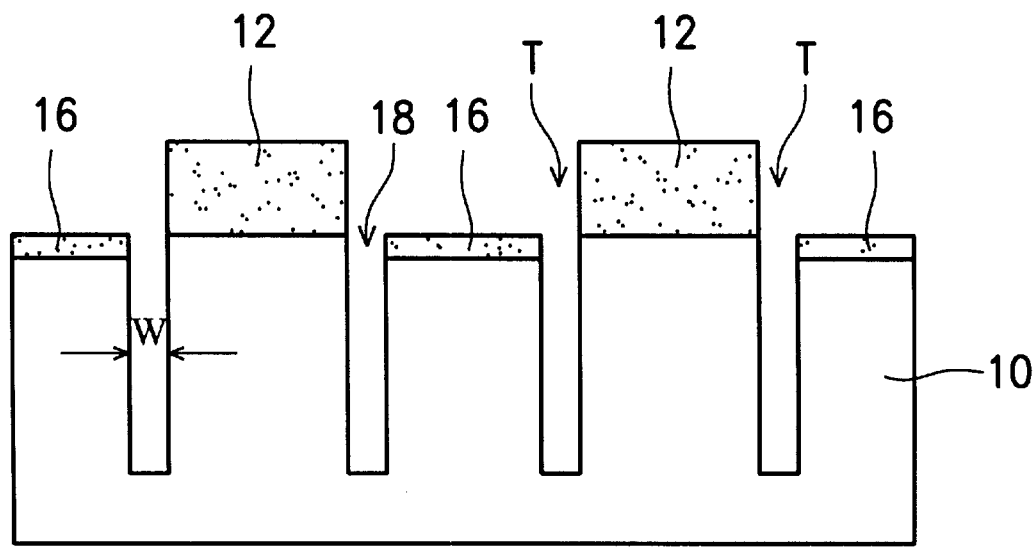

Referring now to FIG. 5, the substrate 10 is then anisotropically etched using the insulator islands 12 and the oxide masks 16 as etch masks, to form at least one trench 18 having a width W when viewed in transverse cross-section. A halogen-based etch recipe can be employed for the isolation trench etch. Alternatively, the etching of the spacers 14 shown in FIG. 4 and the etching of the trenches 18 shown in FIG. 5 can be carried out with a single etch recipe that is selective to the insulator islands 12 and the oxide masks 16.

From the above, it is apparent that the trench width W is decided by the lateral space taken up by the spacers 14, and the lateral space of the spacers 14 is determined by the thickness of the second layer that forms the spacers, rather than by lithography resolution. Therefore, the trench width W can be reduced beyond lithography limit by reducing the thickness of the second layer. Thereby, the isolation trench 18 of the present invention is made narrower and the active area to be formed within the substrate is made wider.

Figure 6:
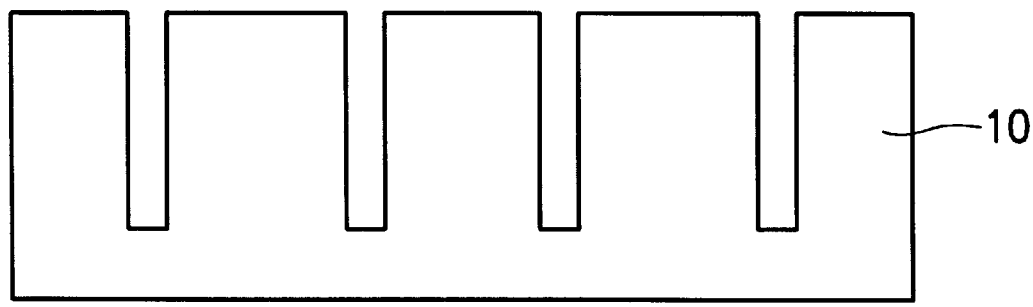

Referring to FIG. 6, the insulator islands 12 and the oxide masks 16 are removed using, for example, a silicon oxide etchant such as buffered oxide etchant (BOE) or hydrofluoric acid (HF).

Figure 7:
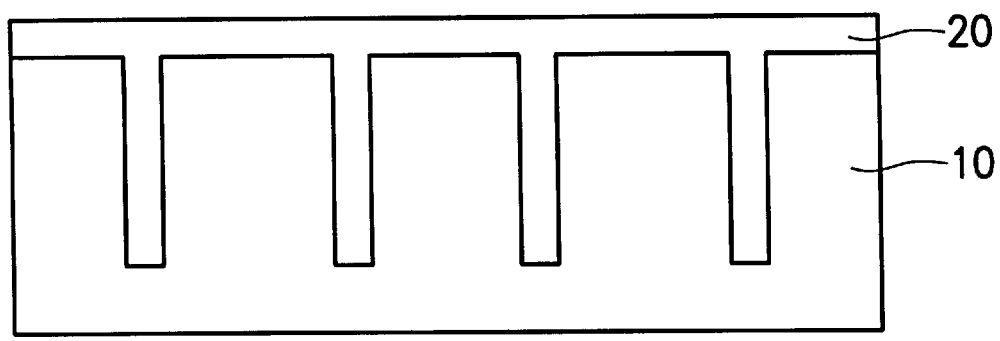

Referring now to FIG. 7, an insulating layer 20 having a predetermined thickness is formed on the substrate 10, including the trenches 18, to bury the trenches. The insulating layer 20 can be formed of undoped silicon glass (USG), for example, by chemical vapor deposition using high density plasma. Alternatively, if the insulator islands 12 are formed of silicon oxide, the insulator islands 12 and the oxide masks 16 may be removed before forming the insulating layer 20 or during subsequent planarization of the insulating layer 20.

According to another aspect of the present invention, a the thermal oxide layer (not shown) having a thickness of approximately 50–250 Å can be formed on the entire surface of the substrate 10, including lining the trenches, before forming the insulating layer 20. The thermal oxide layer 20 can remove defects and stress in the substrate 10, that may be generated during plasma etching for forming the trenches.

Figure 8:
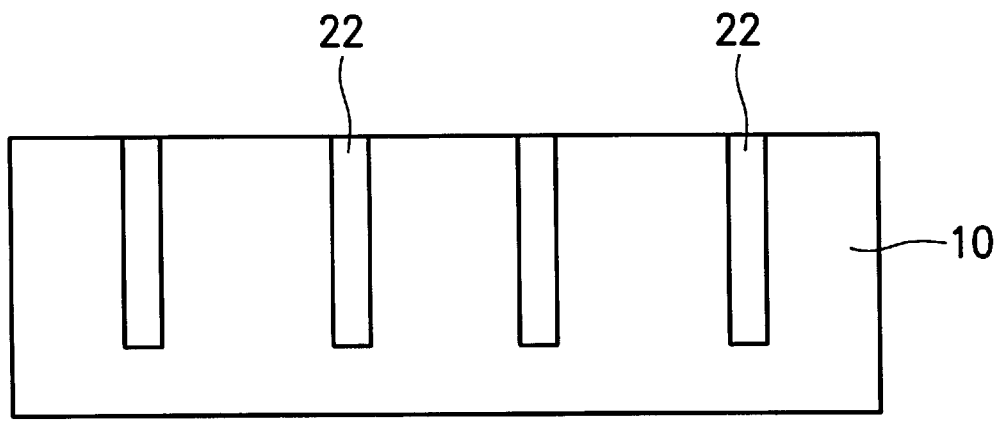

Referring to FIG. 8, a dry etchback and/or chemical-mechanical polishing (CMP) step is performed until the semiconductor substrate 10 is exposed, to planarize the insulating layer 20. Accordingly, isolation regions 22 that bury the trenches 18 are formed.

Figure 9:
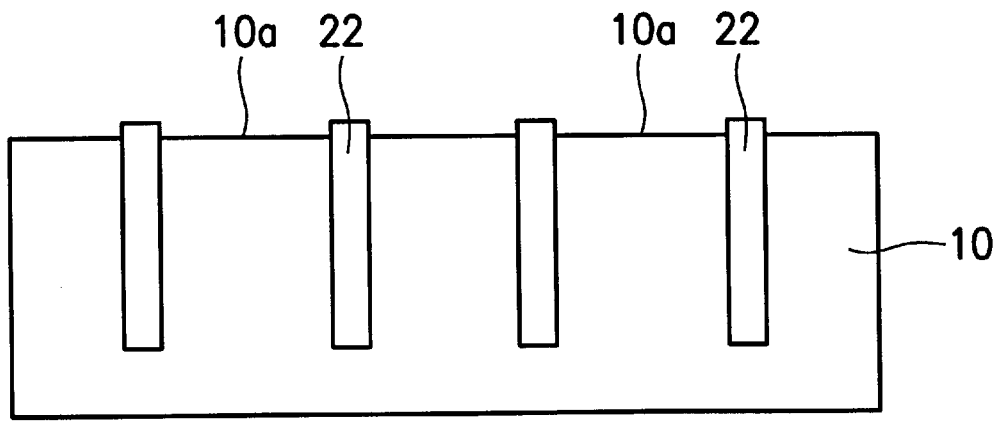

FIG. 9 shows a optional step of etching the surface of the semiconductor substrate 10 to recess the substrate. The substrate 10 is selectively etched to a predetermined depth by wet etching using an etchant capable of etching only the substrate, for example, a mixed solution of $NH_4F$ and HF. According, the surface of the substrate 10a is recessed below the surface of the isolation regions 22. A step between the substrate and the isolation regions is created. The substrate etching may reduce stress generated during the CMP. It may also remove defects and/or particles from the slurry used for the CMP process, from the substrate surface.

While the invention has been particularly shown and described with reference to the preferred embodiment thereof, it will be understood by those skilled in the art that various changes in form and details may be made without departing from the spirit and scope of the invention.

What is claimed is:

1. A method of making an isolation trench structure in a semiconductor substrate, comprising the steps of:

forming a first layer on said semiconductor substrate;

patterning said first layer to form islands on said substrate;

forming spacers on sidewalls of said islands;

thermal oxidizing said substrate to form oxide masks at positions which are not covered with said islands and said spacers;

selectively removing said sidewall spacers to expose the substrate between said islands and said oxide masks;

etching trenches through the exposed substrate using said islands and said oxide masks as etch masks;

forming an insulating layer overlying the substrate and filling the trenches by a deposition; and planarizing the insulating layer until the substrate surface is exposed, thereby forming a plurality of separated isolation regions between the exposed substrate surface in each of the trenches.

2. The method as claimed in claim 1, wherein said first layer is a dielectric layer.

3. The method as claimed in claim 2, wherein said first layer is an oxide layer.

4. The method as claimed in claim 1, wherein the step of forming spacers comprising the steps of:

forming a second layer on the substrate and the islands; and anisotropically etching back the second layer.

5. The method as claimed in claim 4, wherein the second layer is formed of a material substantially different from the first layer.

6. The method as claimed in claim 5, wherein the second layer is formed of silicon nitride.

7. The method as claimed in claim 1, wherein the following step is performed prior to the step of forming an insulating layer in the trench:

removing said islands and said oxide masks from the substrate.

8. The method as claimed in claim 1, wherein the following step is performed after the step of planarizing the insulating layer:

etching the substrate to thereby recess the substrate surface relative to the isolation regions.

9. A method of making an isolation trench structure in a semiconductor substrate, comprising the steps of:

forming an oxide layer on said semiconductor substrate;

patterning said oxide layer to form oxide islands on said substrate;

forming nitride spacers on sidewalls of said islands;

thermal oxidizing said substrate to form oxide masks at positions which are not converted with said islands and said spacers;

selectively removing said sidewall spacers to expose the substrate between said oxide islands and masks;

etching trenches through the exposed substrate using said oxide islands and masks as etch masks, forming an insulating layer overlying the substrate and filing the trenches by a deposition; and planarizing the insulating layer until the substrate surface is exposed, thereby forming a plurality of separated isolation regions between the exposed substrate surface in each of the trenches.

10. The method as claimed in claim 9, wherein the following step is performed prior to the step of forming an insulating layer in the trench:

removing said oxide islands and masks from the substrate.

11. The method as claimed in claim 9, wherein the following step is performed after the step of planarizing the insulating layer:

etching the substrate to thereby recess the substrate surface relative to the isolation regions.

* * * * *